United States Patent
Lobbins et al.

(10) Patent No.: US 6,639,285 B1
(45) Date of Patent: Oct. 28, 2003

(54) METHOD FOR FABRICATING A SEMICONDUCTOR DEVICE

(75) Inventors: Jonathon Marlon Lobbins, Orlando, FL (US); Lauri Monica Nelson, Orlando, FL (US); Danica Deshone Smith, Orlando, FL (US); Dominique A. Wesby, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 105 days.

(21) Appl. No.: 09/713,106

(22) Filed: Nov. 15, 2000

(51) Int. Cl.[7] ............... H01L 31/114; H01L 23/62
(52) U.S. Cl. ............... 257/374; 257/347; 257/291; 438/626; 438/646; 438/698; 438/760
(58) Field of Search .................. 438/622, 646, 438/626, 698, 760

(56) References Cited

U.S. PATENT DOCUMENTS 5,656,556 A * 8/1997 Yang ................ 438/646
6,008,123 A 12/1999 Kook et al.
6,225,170 B1 * 5/2001 Ibok et al. ............... 438/291

OTHER PUBLICATIONS

M. Armacost et al; Plasma–etching processes for ULSI semiconductor circuits; IBM J. Res. Develop. vol. 45 No. 1/2 Jan.–Mar., 1990; 72 pgs.

* cited by examiner

Primary Examiner—David Nelms
Assistant Examiner—Reneé R. Berry
(74) Attorney, Agent, or Firm—James H. Beusse; Beusse Brownlee Bowdoin & Wolter, P.A.

(57) ABSTRACT

A method for making a semiconductor device is provided. The method allows for depositing a layer of a doped dielectric. The method further allows for executing plasma etching so that one or more etchant gases flow over the layer of doped dielectric. A redepositing step allows for redepositing another layer of doped dielectric over the plasma etched layer. The present invention enables to remove crystal defects that may be present in the doped dielectric surface and improve surface planarity.

17 Claims, 4 Drawing Sheets

METHOD FOR FABRICATING A SEMICONDUCTOR DEVICE

BACKGROUND OF THE INVENTION

The present invention is generally related to semiconductor device fabrication, and, more particularly, the present invention is related to method for removing crystal defects in a doped dielectric surface and improving surface planarity using plasma etching.

Throughout the evolution of integrated circuits, one aim of device scaling has been to increase circuit performance and to increase the functional complexity of the circuits. At the outset, scaling down of active device sizes was a very effective means of achieving these goals. Eventually, however, the scaling of active devices became less gainful, as the limitations of the circuit speed and maximum functional density depended more on the characteristics of the interconnects than on the characteristics of the scaled devices. In addition, various aspects, such as silicon utilization, chip cost, and ease and flexibility of integrated circuit design have also been adversely affected by limitations of interconnect technology.

It is believed that most approaches to lifting these limitations have predominantly involved the implementation of multilevel-interconnect schemes. In the course of integrated circuit evolution, the maximum number of devices per chip has steadily increased, mainly as a result of the increase in functional density. Typically, functional density is referred to as the number of interconnected devices per chip area, while the number of devices per chip area is referred to as the active device density. As the minimum feature size on integrated circuits has decreased, the active device density has also increased.

Eventually, a burdensome condition has been reached in which the minimum chip area has become interconnect-limited. That is, the area needed to route the interconnect lines between the active devices has exceeded the area occupied by the active devices. Thus, continued shrinking of active devices has produced less circuit performance benefits. To overcome that issue, multilevel-interconnection within the integrated circuits has been implemented, and as additional levels are added to multilevel-interconnection architectures and circuit features are scaled to submicron dimensions, the demands regarding the required degree of planarization for surfaces of semiconductor wafers continue to grow.

The term planarization is generally well known to those skilled in the art. Those skilled in the art are also familiar with the fact that there are varying degrees of planarization. A planarized surface, as used herein, shall mean a substantially planar surface rather than an absolutely planar surface. Thus, a surface with a higher degree of planarization would be closer to being absolutely planar than a surface with a lower degree of planarization. The surface planarization may be implemented in the conductor, the dielectric layers, or both. As the number of levels in an interconnect technology is increased, the stacking of additional layers on top of one another produces a topography more vulnerable to roughness and other surface defects. Without planarization, the irregularities that result on the wafer surface from the stacking of layers can lead to topography conditions that would eventually reduce the yield of circuits to unacceptably small values.

To overcome the foregoing issues, various planarization techniques are widely used to achieve a high degree of global planarization. One such technique is chemical mechanical polishing (CMP), which consists of a combination of applying chemicals to the dielectric layer and mechanically polishing the wafer. Although very effective for removing any selected portion of the overlying dielectric across the wafer and providing substantially global planarization, CMP is a relatively time consuming and expensive process. For example, the CMP process generally needs to be closely monitored throughout the production and customized each time a different device is produced. This results in high production costs and lost time as the fabrication equipment must be re-calibrated with each successive lot of wafers.

Another difficulty that integrated circuit manufacturers have encountered in the fabrication of the dielectric generally interposed between a substrate and metallized conductive layers is product yield loss due to the formation of crystallite irregularities at the surface of the topmost layer of the dialectric. For example, the dielectric may comprise a base layer of undoped glass followed by one or more layers of doped glass Previous attempts to remove such crystal defects have involved using wet etching techniques. Unfortunately, such wet etching techniques have at best only been partially effective due to the anisotropic etching around the defects that may result in leaving a substantial number of undesirable surface holes or may even create additional defects on the surface of the doped dielectric.

In view of the above-described issues, it would be desirable to provide a method that allows for substantially removing the crystallite irregularities that may appear on the surface of any doped dielectric layers. It would be further desirable if such technique, in addition to substantially removing any such crystals, would simultaneously allow for improving the planarity of the surface of the semiconductor wafer so as to either avoid altogether any costly and time consuming planarization technique or at least significantly reduce the level of planarization that may still be required using known techniques, such as CMP. In either case, this would result in substantially reducing wafer fabrication costs and time.

SUMMARY OF THE INVENTION

Generally speaking, the foregoing needs are fulfilled by providing in one exemplary embodiment of the invention, a method for making a semiconductor device that allows for depositing a first layer of a doped dielectric. The method further allows for executing plasma etching so that one or more etchant gases flow over the first layer of doped dielectric. A second depositing step allows for depositing a second layer of doped dielectric over the plasma etched layer.

The present invention further fulfills the foregoing needs by providing in another aspect thereof, a semiconductor device including a first layer of doped dielectric, wherein said first layer is processed using plasma etching to form a plasma-etched layer. The semiconductor device further includes a second layer of doped dielectric deposited over the plasma-etched layer, wherein an interface boundary between said first and second layers comprises a respective indentation.

In yet another aspect thereof, the present invention provides a semiconductor device including a first layer of doped dielectric, e.g., Boro Phosphor Silicate Glass having an upper surface, and a second layer of doped dielectric, e.g., Boro Phosphor Silicate Glass, deposited directly on the first layer.

Figure 1:
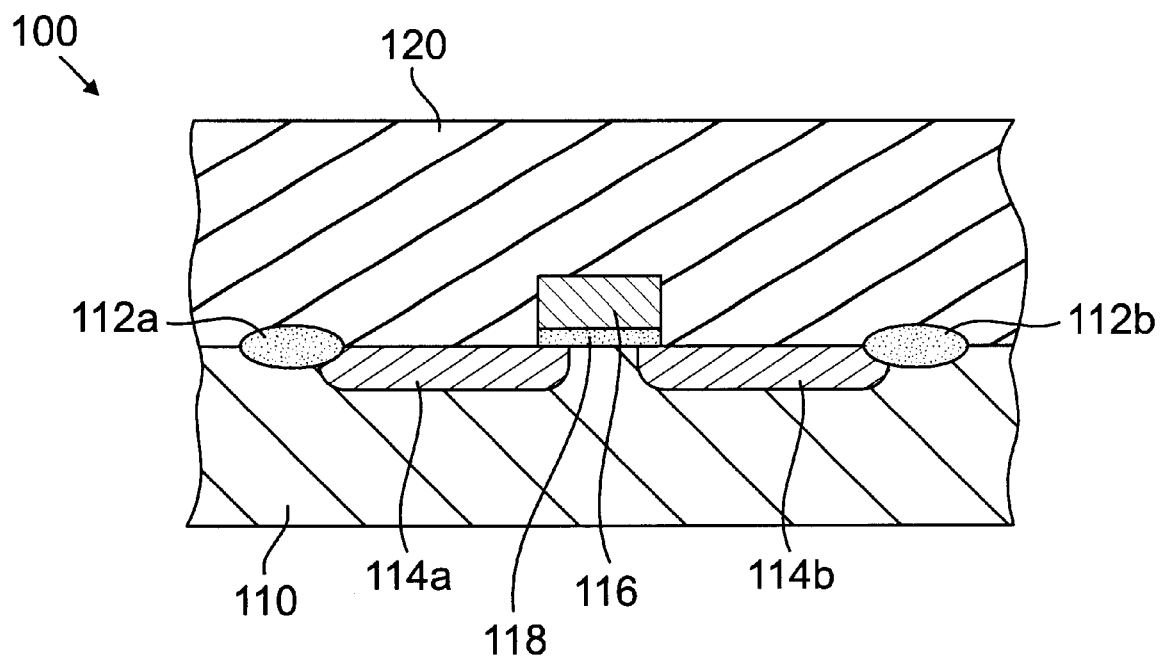
FIG. 1 illustrates an exemplary schematic cross-section of a typical semiconductor device including a dielectric layer that may benefit from the techniques of the present invention.

Before any embodiment of the invention is explained in detail, it is to be understood that the invention is not limited in its application to the details of construction and the arrangements of components set forth in the following description or illustrated in the drawings. The invention is capable of other embodiments and of being practiced or being carried out in various ways. Also, it is to be understood that the phraseology and terminology used herein is for the purpose of description and should not be regarded as limiting.

DETAILED DESCRIPTION OF THE INVENTION

Referring initially to FIG. 1, illustrated is an exemplary schematic cross-section of a typical metal oxide semiconductor (MOS) device 100. As illustrated in FIG. 1, the semiconductor device 100 includes a substrate 110, which may be formed from materials such as silicon, germanium, gallium arsenide or other materials known to those skilled in the art. The substrate 110 will typically include field oxide regions 112a, 112b and doped source and drain regions 114a, 114b, both of which are formed by conventional processes. A gate 116 positioned on a gate oxide 118 may also be formed on the substrate 110. Both the gate 116 and the gate oxide 118 are also formed by conventional processes. Deposited over the gate 116 and the substrate 110 is a dielectric layer 120 that, as described in greater detail below, may benefit from the techniques of the present invention.

Figure 2:
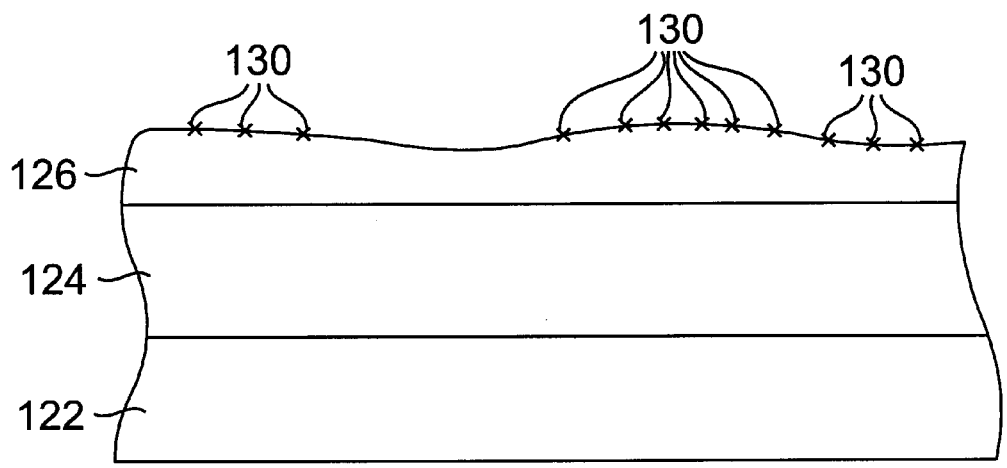
FIG. 2 illustrates further details in connection with the dielectric layer of FIG. 1.

In one exemplary embodiment, as best seen in FIG. 2, dielectric layer 120 may comprise a multi-layer dielectric including a base layer 122 of undoped silicate glass (USG) upon which there may be stacked one or more layers, such as layers 124 and 126 doped with phosphorous, boron, fluorine or any other suitable dopant material. In one exemplary arrangement, doped layer 124 may comprise Phosphorous Doped Silicate Glass (PSG) and top-most layer 126 may comprise Boron Phosphorous Doped Silicate Glass (BPSG). It will be appreciated that the present invention is not limited to that exemplary arrangement since other arrangements and glass material, e.g., Fluorine Doped Silicate Glass (FSG), could be utilized. As shown in FIG. 2, due to anomalous conditions, layer 126 may include a plurality of crystallite deformities made up in one exemplary embodiment of $BPO_4$ and represented by respective star symbols 130. As further shown in FIG. 2, in addition to the crystallite deformities, layer 126 may further exhibit non-planarities as represented by the undulations shown in FIG. 2. It will be appreciated that both the crystallite deformities and non-planarities, e.g., undulations, are undesirable. For example, if the number of crystallite defects exceeds a predefined number, then the wafer manufacturer will have to discard any wafers exhibiting such anomalies. Similarly, the higher the level of non-planarity of the wafer, then the wafer manufacturer has to allocate more resources, e.g., costly CMP processing time, to reach the desired level of planarity.

The inventors of the present invention have discovered that conducting plasma etching on dielectric layer 126 results in substantial removal of the crystallite defects. The inventors of the present invention further discovered that such plasma etching not only results in substantial elimination of the crystallite defects but unexpectedly and advantageously results in a substantial planarity increase of dielectric layer 126.

Figure 3:
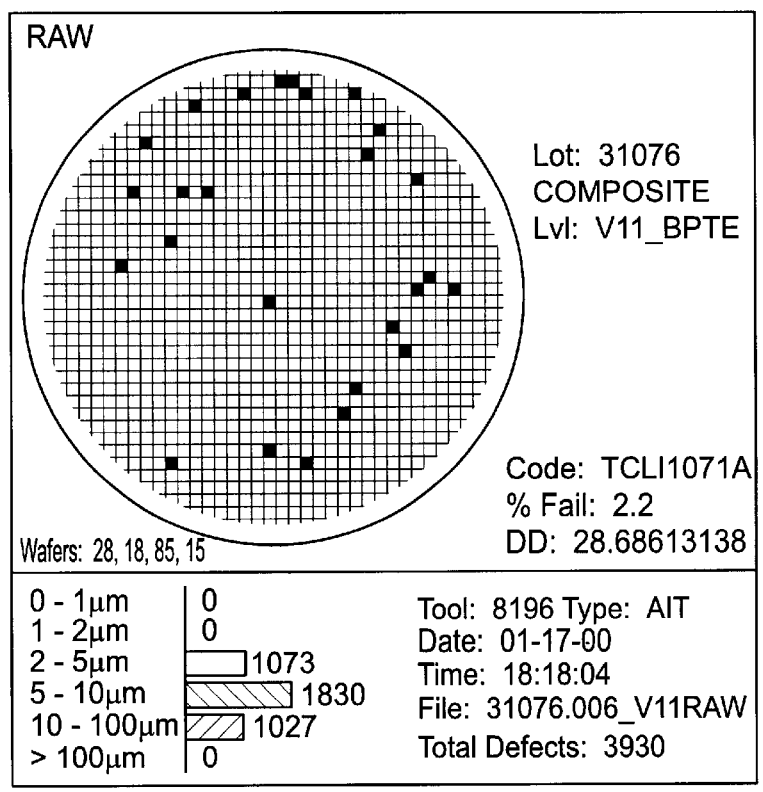
FIGS. 3 and 4 comparatively map an exemplary number of crystallite defects in an untreated wafer (FIG. 3) against a wafer treated with plasma etch in accordance with one aspect of the present invention.
Figure 4:
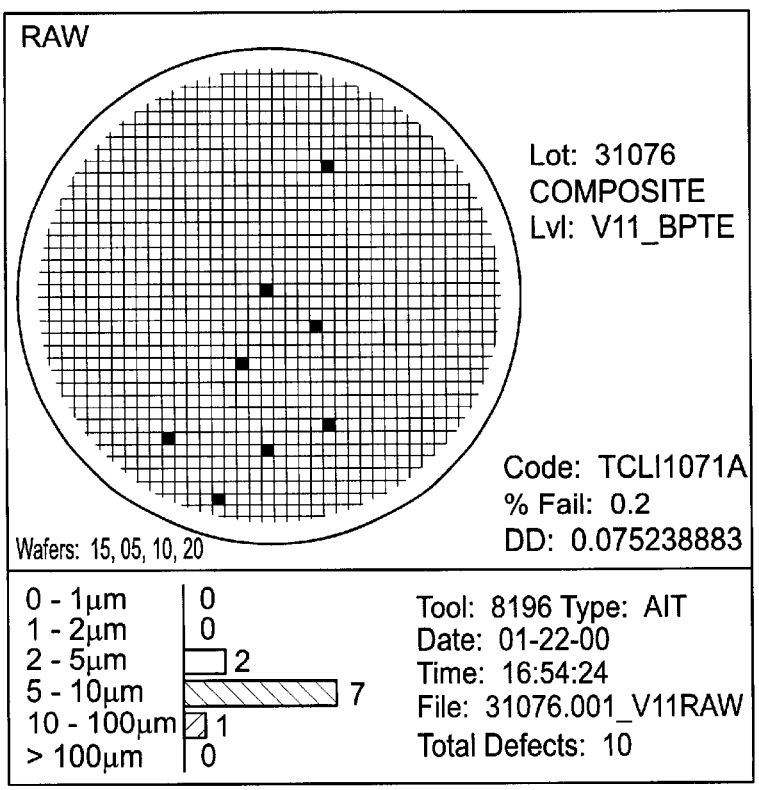

FIGS. 3 and 4 graphically illustrate exemplary statistical analysis results as respectively conducted in a layer 126 prior to plasma etching (FIG. 3) and post-etching (FIG. 4). It will be observed that in this exemplary result, the total number of defects were reduced from about 3090 to just about 18. It will be appreciated that the wafer shown in FIG. 3 would have been discarded with concomitant revenue losses. Thus, the plasma etching conducted on layer 126 allows to cure defects that would have otherwise resulted in discarding the wafer.

Figure 5:
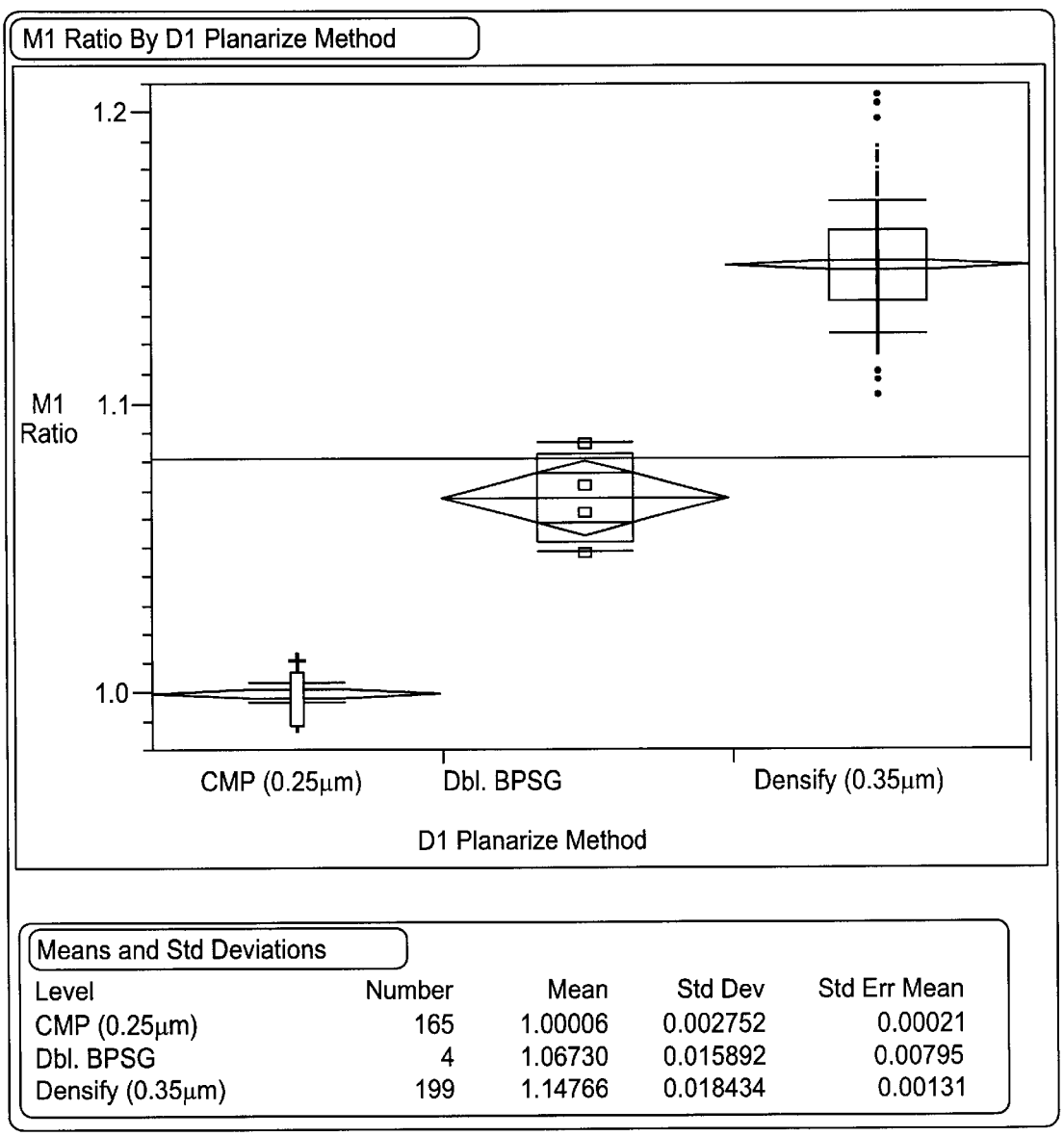
FIG. 5 illustrate exemplary metal ratios indicative of respective dielectric surface planarity including improved metal ratios as are now achievable in accordance with another aspect of the present invention, and wherein that improved planarity allow for substantially reducing CMP processing time.

FIG. 5 illustrates exemplary planarity measurements indicative of the level of planarity of the dielectric surface. By way of example such ratios may comprise metal ratios determined through the use of planarity measurement techniques well-understood by those of ordinary skill in the art. As used herein, a metal ratio is defined as the ratio of the resistance of a conductive line over a given topography divided by the resistance of the conductor line in an absolutely flat area. Thus, as the surface topography approaches being absolutely flat, then the ratio would approach unity. It will be appreciated that dielectric layer 126 untreated with the plasma etching exhibits the highest degree of roughness, (e.g., a metal ratio having a value of approximately 1.15) as compared to the plasma etched surface (e.g., a metal ratio having a value of approximately 1.06) and as further compared to a dielectric layer subsequent to CMP treatment (e.g., a metal ratio having a value of approximately one). From the foregoing it will be appreciated, that in one advantageous feature of the present invention, if one desires to more quickly and inexpensively obtain a degree of planarity, such as may be achieved with any subsequent CMP treatment, then instead of starting with the relatively lower degree of planarity of the unetched dielectric surface, one would start with the relatively higher degree of planarity now achievable with the layer having undergone the plasma etching. Based on time/cost analysis performed to estimate the time reduction in CMP processing now afforded by the present invention, it is believed that processing time will be reduced by approximately 47% as compared to historical times measured prior to the present invention. In other words, if one starts with a surface layer having a metal ratio of approximately 1.15 in lieu of approximately 1.06 one would have to spend 47% more CMP processing time to reach a metal ratio of approximately one. The analysis further suggests that such reduction in CMP processing time will result in substantial cost savings per wafer.

The description that follows provides brief background information regarding plasma etching in general followed by a tabulation that lists in Table 1 below exemplary ranges of main influencing parameters used to etch layer 126 (FIG. 2) in accordance with one aspect of the present invention.

As will be understood by those of ordinary skill in the art, a plasma is a partially ionized gas which contains positive and negative ions, electrons, reactive neutrals and radicals. It is formed by applying large electromagnetic fields to a volume of gas in a reactor. These large fields excite some electrons so that they detach from their atomic orbital shells. These liberated electrons are precursors to further ionization (electron impact ionization), excitation of bound electrons to higher level orbits, and formation of molecular and atomic radicals. A plasma is macroscopically neutral, with equal numbers of positively and negatively charged species. The distinctive glow is produced as species excited by high energy electrons undergo relaxation to lower energy levels and re-emit the energy as light.

In most plasmas that are used for plasma etching, the amount of ionization is relatively small. Roughly, there is only one charged particle per $10^5$ to $10^6$ neutral atoms and molecules. Positively charged species are mostly singly ionized neutrals that have lost an electron. Typically, the majority of negative particles are free electrons. When electronegative gases are used, negative ions can be more abundant in the plasma.

It will be appreciated that as used herein the term plasma etching is used to generically describe dry etching in any equipment or processing conditions. As suggested above, plasma etching generally allows highly directional pattern transfer from a masking layer to the film being etched. Plasma etching is further able to meet the constraints of advanced manufacturing that include, extremely accurate control of the size of nanometer scale features, high selectivity to masking materials and underlying films, and high throughput that maximizes return on investment.

As set forth below, Table 1 lists exemplary parameters and respective ranges for the etching process that in accordance with one aspect of the present invention are believed to result in the advantageous results described in the context of FIGS. 1–5. Namely cure of crystallite defects on a surface of a doped dielectric layer and improved planarization of that surface.

TABLE 1

| Parameter | Low | Target | High |
| --- | --- | --- | --- |
| Etch Time (Sec) | 1 | 12 | 80 |
| Plasma Pressure (mTorr) | 30 | 100 | 400 |
| RF Power (W) | 10 | 600 | 1200 |
| Magnetic Field (Gauss) | 0 | 15 | 70 |
| CHF3 Flow(sccm) | 5 | 60 | 400 |
| CF4 Flow (sccm) | 5 | 20 | 300 |
| Ar Flow (sccm) | 5 | 20 | 300 |
| Etched Thickness (A) | 10 | 1000 | 10,000 |

As will be understood by those skilled in the art, etch time refers to the total time the wafer is being etched. In one exemplary embodiment, each of the exemplary etchant gases listed in Table 1 are used simultaneously with one preferable combination listed under the heading "Target". Although etch results are likely to vary depending on the specific combination of etchant gases, it is believed that the present invention is not limited to a three-way combination of etchant gases since the etchant gases could be used singly or in two-way combinations with one another using the listed ranges. It will be further appreciated that the present invention is not limited to the etchant gases listed in Table 1 being that as used herein etchant gas refers to any substance, gaseous or otherwise that results in the removal of material from a doped dielectric layer during plasma etching. In one exemplary embodiment, such etching equipment used for practicing the invention is generally referred to in the art as a Magnetically-Enhanced Reactive Ion Etcher (MERIE), such as etcher model 5200 MXP, commercially available from Applied Materials Inc., CA. It will be appreciated that the present invention is not limited to such etcher equipment since the techniques of the present invention may be adaptable to other types of plasma etching equipment, such as capacitively-coupled RF discharge equipment. It will be appreciated that MERIE equipment is generally classified by those skilled in the art as a subset of the set of plasma equipment that broadly encompasses capacitively-coupled RF discharge equipment.

Figure 6:
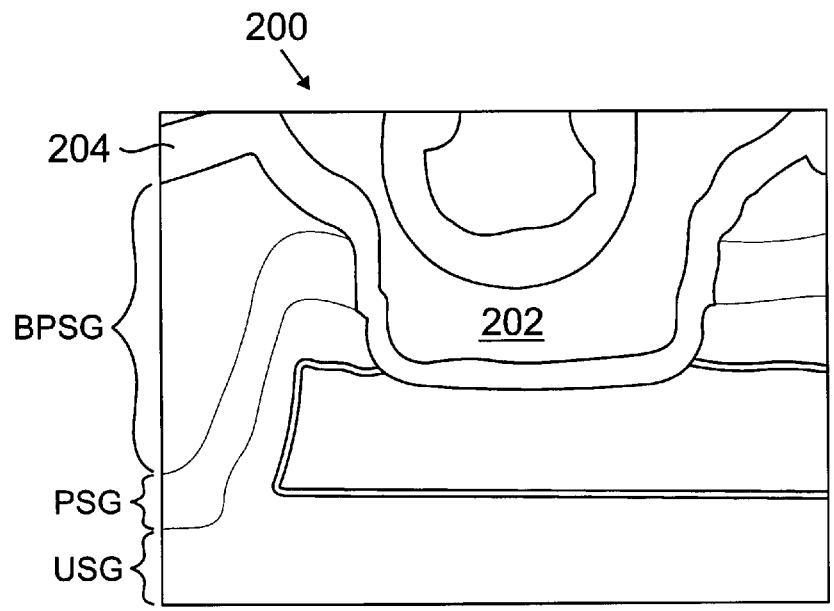
FIG. 6 illustrates an exemplary cross section view of a semiconductor device including a window in a layer of doped dielectric without plasma etching.
Figure 7:
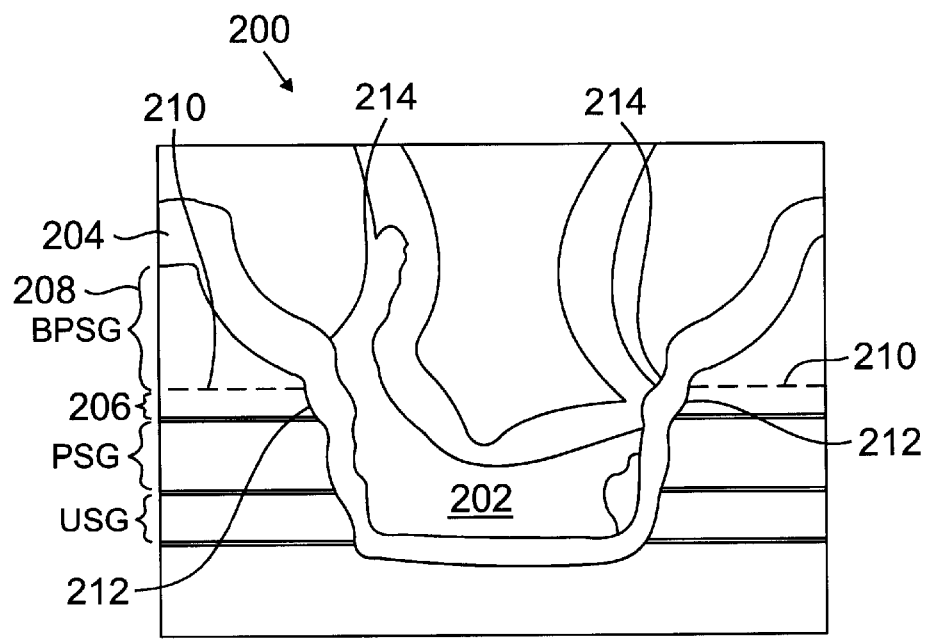
FIG. 7 illustrates an exemplary cross section of a semiconductor device including a window through first and second layers of doped dielectric processed in accordance with one aspect of the present invention.

FIGS. 6 and 7 illustrate respective exemplary cross sectional views, such as may be obtained with a Scanner Electron Microscope (SEM); of a semiconductor device 200. As shown in FIG. 6, semiconductor device 200 includes a window 202 etched in a single layer of doped dielectric, e.g., the layer designated with the letters BPSG, such as may be etched using techniques well-understood by those of ordinary skill in the art. Device 200 further includes a layer of conductive material, e.g., a metal layer 204, deposited over the single layer of doped dielectric.

By way of comparison, FIG. 7 illustrates an exemplary cross section of semiconductor device 200 wherein window 202 is etched through first and second layers 206 and 208 of doped dielectric. In accordance with one aspect of the present invention, first layer 206 is processed using plasma etching to form a plasma-etched layer. The second layer 208 of doped dielectric is then deposited over first layer 206. As shown in FIG. 7, an interface boundary 210 between first and second layers 206 and 208 includes a respective indentation 212 along each side of window 202. As further shown in FIG. 7, metal layer 204 includes a segment 214 configured to correspond to the respective indentation. It is believed that the indentation feature, which is not present in the semiconductor device shown in FIG. 6, allows for detecting the presence of the first and second layers of doped dielectric formed in accordance with the teachings of the present invention.

It will be understood that the specific embodiment of the invention shown and described herein is exemplary only. Numerous variations, changes, substitutions and equivalents will now occur to those skilled in the art without departing from the spirit and scope of the present invention. Accordingly, it is intended that all subject matter described herein and shown in the accompanying drawings be regarded as illustrative only and not in a limiting sense and that the scope of the invention be solely determined by the appended claims.

What is claimed is:

1. A semiconductor device comprising:
   a first layer of doped dielectric wherein said first layer is processed using a plasma etch to form a substantially planar plasma-etched layer before any other layer is deposited on the first layer; and
   a second layer of doped dielectric deposited over the plasma etched layer.

2. The device of claim 1 wherein the first layer comprises a first degree of planarity and further wherein the planarity of the second layer comprises a second degree of planarity higher than said first degree of planarity.

3. The device of claim 2 wherein said second layer is processed using chemical mechanical polishing to achieve a third degree of planarity higher than said second degree of planarity, the processing time for executing said chemical mechanical polishing being substantially reduced relative to the processing time it would be required to reach the third degree of planarity absent said plasma etching.

4. A semiconductor device comprising:
   a first layer of a doped dielectric wherein said first layer is processed using plasma etch to form a plasma-etched layer; and
   a second layer of doped dielectric deposited over the plasma-etched layer wherein an interface boundary between said first and second layers comprises a respective indentation.

5. The semiconductor device of claim 4 wherein said indentation is along a respective side of a window etched in said first and second layers.

6. The semiconductor device of claim 5 further comprising a metal layer deposited over said second layer, a segment of said metal layer over said interface boundary being configured to correspond to the respective indentation therein.

7. A semiconductor device comprising:
   a first layer comprising Boro Phosphor Silicate Glass having an upper surface processed to form a substantially planar surface before any other layer is deposited on the first layer; and
   a second layer of Boro Phosphor Silicate Glass deposited directly on the upper surface of the first layer.

8. The device of claim 7 wherein the first layer comprises a first degree of planarity and further wherein the planarity of the second layer comprises a second degree of planarity higher than said first degree of planarity.

9. The device of claim 8 wherein said second layer is processed using chemical mechanical polishing to achieve a third degree of planarity higher than said second degree of planarity, the processing time for performing said chemical mechanical polishing being substantially reduced relative to the processing time it would be required to reach the third degree of planarity absent a plasma etch of said first layer.

10. The device of claim 7 wherein the first layer and the second layer are of substantially the same chemical composition.

11. The device of claim 7 wherein the first and second layers each consist essentially of Boro Phosphor Silicate Glass.

12. A semiconductor device comprising:
    a first layer comprising Boro Phosphor Silicate Glass having an upper surface processed to form a substantially planar surface before any other layer is deposited on the first layer; and
    a second layer of Boro Phosphor Silicate Glass deposited directly on the first layer.

13. The device of claim 12 wherein an interface boundary between said first and second layers comprises a respective indentation.

14. The semiconductor device of claim 13 wherein said indentation is along a respective side of a window etched in said first and second layers.

15. The semiconductor device of claim 14 further comprising a metal layer deposited over said second layer, a segment of said metal layer over said interface boundary being configured to correspond to the respective indentation therein.

16. The device of claim 11 wherein the first layer and the second layer are of substantially the same chemical composition.

17. The device of claim 11 wherein the first and second layers each consist essentially of Boro Phosphor Silicate Glass.

* * * * *